US012756157B2

(12) United States Patent
Noda et al.

(10) Patent No.: US 12,756,157 B2
(45) Date of Patent: Oct. 6, 2026

(54) PHOTONIC CRYSTAL SURFACE LIGHT-EMITTING LASER ELEMENT

(71) Applicants: KYOTO UNIVERSITY, Kyoto (JP); STANLEY ELECTRIC CO., LTD., Tokyo (JP)

(72) Inventors: Susumu Noda, Kyoto (JP); Takuya Inoue, Kyoto (JP); Kei Emoto, Tokyo (JP); Tomoaki Koizumi, Tokyo (JP)

(73) Assignees: KYOTO UNIVERSITY, Kyoto (JP); STANLEY ELECTRIC CO., LTD., Tokyo (JP)

( * ) Notice: Subject to any disclaimer, the term of this patent is extended or adjusted under 35 U.S.C. 154(b) by 776 days.

(21) Appl. No.: 18/016,276

(22) PCT Filed: Jul. 1, 2021

(86) PCT No.: PCT/JP2021/024952
§ 371 (c)(1),
(2) Date: Jan. 13, 2023

(87) PCT Pub. No.: WO2022/014343
PCT Pub. Date: Jan. 20, 2022

(65) Prior Publication Data

US 2023/0275398 A1 Aug. 31, 2023

(30) Foreign Application Priority Data

Jul. 14, 2020 (JP) ................................ 2020-120961

(51) Int. Cl.
*H01S 5/11* (2021.01)
*H01S 5/042* (2006.01)
(Continued)

(52) U.S. Cl.
CPC ............ *H01S 5/11* (2021.01); *H01S 5/04253* (2019.08); *H01S 5/04256* (2019.08);
(Continued)

(58) Field of Classification Search
CPC .... H01S 5/11; H01S 5/04253; H01S 5/04256; H01S 5/18305; H01S 5/18344; H01S 5/2202
See application file for complete search history.

(56) References Cited

U.S. PATENT DOCUMENTS 6,683,898 B2 1/2004 Oestergaard et al.
2007/0013991 A1 1/2007 Kise et al.
(Continued)

FOREIGN PATENT DOCUMENTS

JP 4294023 B2 4/2009
JP 2018113490 A 7/2018
(Continued)

OTHER PUBLICATIONS

International Search Report (ISR) dated Aug. 10, 2021 issued in International Application No. PCT/JP2021/024952.
(Continued)

*Primary Examiner* — Yuanda Zhang
(74) *Attorney, Agent, or Firm* — Holtz, Holtz & Volek PC

(57) ABSTRACT

A photonic-crystal surface-emitting laser element includes: a first semiconductor layer formed by embedding a photonic crystal layer that includes air holes arranged with two-dimensional periodicity in a formation region in a plane parallel to the photonic crystal layer; an active layer formed on the first semiconductor layer; a second semiconductor layer formed on the active layer; and a mesa portion with a mesa shape formed at a surface of the second semiconductor layer, wherein the mesa portion is located inside the formation region of the air holes when viewed in a direction perpendicular to the photonic crystal layer.

5 Claims, 11 Drawing Sheets

(51) Int. Cl.

| | |
|---|---|
| ***H01S 5/065*** | (2006.01) |
| ***H01S 5/183*** | (2006.01) |
| ***H01S 5/22*** | (2006.01) |
| ***H01S 5/343*** | (2006.01) |

(52) U.S. Cl.

CPC ........ *H01S 5/0653* (2013.01); *H01S 5/18305* (2013.01); *H01S 5/18344* (2013.01); *H01S 5/2202* (2013.01); *H01S 5/34333* (2013.01); *H01S 5/34386* (2013.01); *H01S 5/04254* (2019.08)

(56) References Cited

U.S. PATENT DOCUMENTS

| | | | | |
|---|---|---|---|---|
| 2010/0172390 | A1 | 7/2010 | Matsubara et al. | |
| 2011/0134941 | A1* | 6/2011 | Hoshino | H01S 5/187 372/7 |
| 2016/0020580 | A1 | 1/2016 | Takiguchi et al. | |
| 2018/0048120 | A1 | 2/2018 | Yoshida et al. | |
| 2019/0013647 | A1 | 1/2019 | Higuchi et al. | |
| 2021/0273411 | A1 | 9/2021 | Uenoyama et al. | |
| 2021/0391691 | A1 | 12/2021 | Sugiyama et al. | |

FOREIGN PATENT DOCUMENTS

| | | | |
|---|---|---|---|
| JP | 2019016750 | A | 1/2019 |
| JP | 2019106398 | A | 6/2019 |
| JP | 2019201065 | A | 11/2019 |
| JP | 2020068330 | A | 4/2020 |
| WO | 2008018220 | A1 | 2/2008 |

OTHER PUBLICATIONS

Written Opinion (WO) dated Aug. 10, 2021, issued in International Application No. PCT/JP2021/024952.

Liang, et al., "Three-dimensional coupled-wave model for square-lattice photonic crystal lasers with transverse electric polarization: A general approach", Phys. Rev. B vol. 84 (2011) 195119.

Tanaka, et al., "Discussion of In-plane Diffraction and Threshold Gain Difference in PCSEL", Preprints of Autumn Meeting of 2016 of Japan Society of Applied Physics.

Yoshida, et al., "Experimental Investigation of Lasing Modes in Double-Lattice Photonic-Crystal Resonators and Introduction of In-Plane Heterostructures", Proceedings of the IEEE (2019), vol. 108, No. 5, pp. 819-826, May 2020.

Extended European Search Report (EESR) dated Oct. 30, 2023, issued in counterpart European Application No. 21841437.3.

* cited by examiner

PHOTONIC CRYSTAL SURFACE LIGHT-EMITTING LASER ELEMENT

TECHNICAL FIELD

The present invention relates to a photonic-crystal surface-emitting laser element.

BACKGROUND ART

Photonic-crystal surface-emitting lasers using photonic crystals (PCs) have been developed in recent years.

For example, Non-Patent Literature 1 discloses an in-plane diffraction effect and a threshold gain difference of a photonic-crystal laser. Non-Patent Literature 2 discloses a three-dimensional coupled-wave model of a square lattice photonic-crystal laser.

Photonic-crystal surface-emitting lasers having multi-lattice photonic crystals in which a plurality of air holes of different sizes are arranged at lattice points are also known.

For example, Patent Literature 1 describes a two-dimensional photonic-crystal surface-emitting laser light source including a two-dimensional photonic crystal in which, in a plate-shaped base material, a large number of different-refractive-index region aggregates each composed of a plurality of regions that differ in refractive index from the base material and include at least two regions different in thickness from each other are periodically arranged.

Non-Patent Literature 3 discloses suppressing multi-mode oscillation, which causes beam quality degradation, by changing the air hole size and the lattice constant of a photonic crystal.

However, since a photonic crystal has very small air holes, it is difficult to manufacture a photonic-crystal surface-emitting laser with an accurate air hole size and lattice constant.

For such two-dimensional photonic-crystal surface-emitting laser elements, it is important to realize a laser element that has high beam quality and is stable even at high current injection while maintaining basic mode by suppressing oscillation in higher-order mode.

CITATION LIST

Patent Literature

Patent Literature 1: Japanese Patent No. 4294023

Non-Patent Literatures

Non-Patent Literature 1: Tanaka et al., Japanese Society of Applied Physics Autumn Meeting 2016 preprints, 15p-B4-20

Non-Patent Literature 2: Y. Liang et al., Phys. Rev. B Vol. 84 (2011) 195119

Non-Patent Literature 3: M. Yoshida et al., Proceedings of the IEEE (2019). "Experimental Investigation of Lasing Modes in Double-Lattice Photonic-Crystal Resonators and Introduction of In-Plane Heterostructures."

SUMMARY OF INVENTION

Technical Problem

The present invention has an object of providing a photonic-crystal surface-emitting laser element that is stable and has high beam quality while maintaining basic mode even at high current injection by suppressing oscillation in higher-order mode.

Solution to Problem

A surface-emitting laser element according to one aspect of the present invention is a photonic-crystal surface-emitting laser element including a photonic crystal layer, the photonic-crystal surface-emitting laser element including: a first semiconductor layer formed by embedding the photonic crystal layer that includes air holes arranged with two-dimensional periodicity in a formation region in a plane parallel to the photonic crystal layer; an active layer formed on the first semiconductor layer; a second semiconductor layer formed on the active layer; and a mesa portion with a mesa shape formed at a surface of the second semiconductor layer, wherein the mesa portion is located inside the formation region of the air holes when viewed in a direction perpendicular to the photonic crystal layer.

DESCRIPTION OF EMBODIMENTS

Figure 1A:
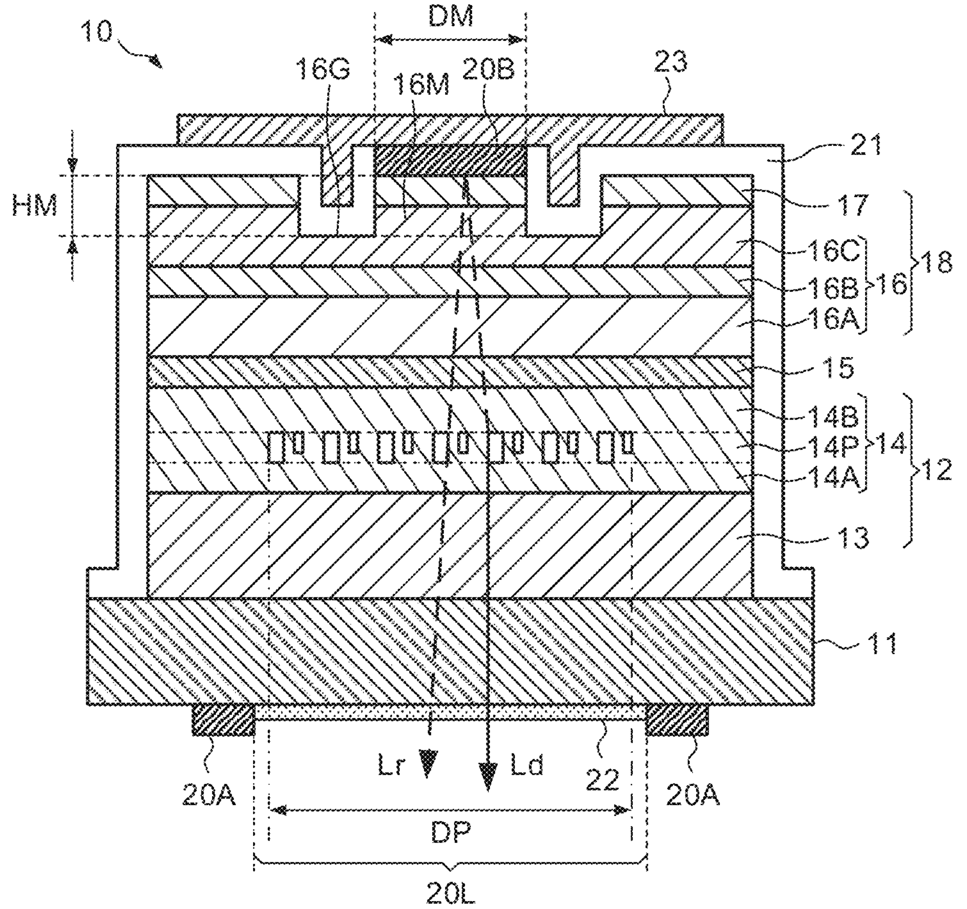
FIG. 1A is a cross-sectional view schematically illustrating an example of the structure of a photonic-crystal laser element (PCSEL element) 10 in Example 1.

While preferred embodiments of the present invention will be described below, such embodiments may be modified or combined as appropriate. In the following description and the accompanying drawings, substantially the same or equivalent portions are given the same reference numerals.

Example 1

[Structure of Photonic-Crystal Surface-Emitting Laser]

A photonic-crystal surface-emitting laser (hereinafter also referred to "PCSEL") is an element that includes a resonator layer in a direction parallel to a semiconductor light-emitting structure layer (n-guide layer, light-emitting layer, and p-guide layer) constituting a light-emitting element, and emits coherent light in a direction orthogonal to the resonator layer.

There is known a distributed Bragg reflector (DBR) laser including a pair of resonator mirrors (Braggs reflectors) sandwiching a semiconductor light-emitting layer. The photonic-crystal surface-emitting laser (PCSEL) is different from the DBR laser in the following point: In the photonic-crystal surface-emitting laser (PCSEL), light waves propagating in a plane parallel to the photonic crystal layer are diffracted by the diffraction effect of the photonic crystal to form a two-dimensional resonant mode, and are diffracted in a direction perpendicular to the parallel plane as well. That is, the light extraction direction is perpendicular to the direction of resonance (in the plane parallel to the photonic crystal layer).

FIG. 1A is a cross-sectional view schematically illustrating an example of the structure of a photonic-crystal laser element (PCSEL element) 10 in Example 1. The PCSEL element 10 is formed by laminating a plurality of semiconductor layers on a substrate. The semiconductor layers are, for example, made of a hexagonal nitride semiconductor such as a GaN-based semiconductor.

In more detail, an n-cladding layer (first cladding layer of a first conductivity type) 13, an n-guide layer (first guide layer) 14, an active layer 15, a p-guide layer (second guide layer) 16, and a p-contact layer 17 are formed on a substrate 11 in this order.

The n-cladding layer (first cladding layer of the first conductivity type) 13 and the n-guide layer (first guide layer) 14 constitute a first semiconductor layer 12, and the second guide layer 16 and the p-contact layer 17 constitute a second semiconductor layer 18. The first semiconductor layer 12 includes semiconductor layers of the first conductivity type (for example, n type), and the second semiconductor layer 18 includes semiconductor layers of a conductivity type (for example, p type) opposite to the first conductivity type.

The n-guide layer (first guide layer) 14 includes a lower guide layer 14A, a photonic crystal layer (air hole layer or PC layer) 14P, and an embedding layer 14B. The photonic crystal layer 14P includes air holes arranged with two-dimensional periodicity in a plane parallel to the photonic crystal layer 14P In this embodiment, the photonic crystal layer 14P is parallel to the active layer 15.

The second guide layer 16 includes a first p-side semiconductor layer 16A located on the active layer 15, an electron blocking layer (EBL) 16B located on the first p-side semiconductor layer 16A, and a second p-side semiconductor layer 16C located on the electron blocking layer 16B.

The p-contact layer 17 formed on the second guide layer 16 is a semiconductor layer that improves ohmic contact with a metal electrode and has a smaller energy band gap and/or a higher impurity concentration than the second p-side semiconductor layer 16C.

While the following describes the case where the first conductivity type is n type and the second conductivity type opposite to the first conductivity type is p type, the first and second conductivity types may be p and n types respectively.

Herein, "n-" and "p-" refer to "n side" and "p side", and not necessarily to n type and p type. For example, the n-guide layer refers to a guide layer located on the n side of the active layer, and may be an undoped layer (or i layer).

The n-cladding layer 13 may include a plurality of layers instead of a single layer. In such a case, all of the layers do not need to be n-type layers (n-doped layers), and one or more undoped layers (i layer(s)) may be included. The same applies to the p-guide layer (second guide layer) 16.

Although the above describes the detailed specific semiconductor layer structure of the photonic-crystal laser element 10, this is merely an example of the element structure. The photonic-crystal laser element 10 is not limited as long as it includes the first semiconductor layer (or first guide layer) including the photonic crystal layer 14P, the second semiconductor layer (or second guide layer), and the active layer (light-emitting layer) sandwiched between these layers and is configured to emit light by current injection to the active layer.

For example, the photonic-crystal laser element need not include all of the semiconductor layers described above. The photonic-crystal laser element may include various semiconductor layers (for example, hole barrier layer, optical confinement layer, current confinement layer, tunnel junction layer, etc.) for improving the element characteristics.

An annular n electrode (cathode) 20A is formed on the back surface of the substrate 11. An antireflection film 22 is provided inside the n electrode 20A on the back surface of the substrate 11 as a laser light emitting surface.

At the top surface of the second semiconductor layer 18, a groove 16G is formed from the surface of the second semiconductor layer 18 (i.e., the surface of the p-contact layer 17) to the inside of the second p-side semiconductor layer 16C, as illustrated in FIG. 1A.

The groove 16G is not limited as long as it has a depth reaching the inside of the second guide layer 16, and may be formed, for example, as a groove of a depth to the inside of the second p-side semiconductor layer 16C.

Figure 2A:
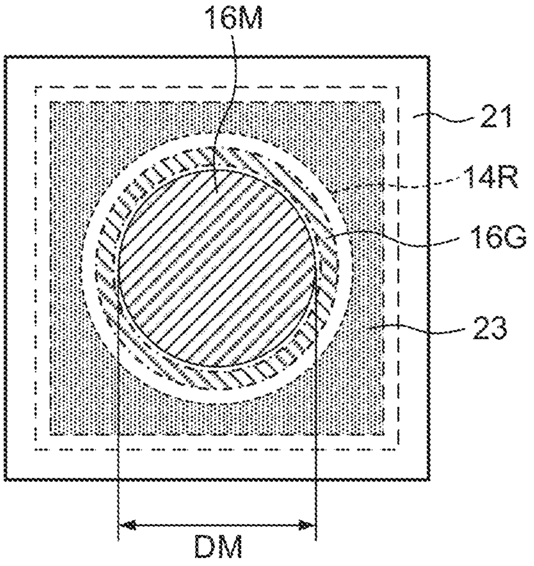
FIG. 2A is a plan view schematically illustrating the top surface of the photonic-crystal laser 10.

As illustrated in FIG. 2A, the groove 16G is formed as an annular groove that surrounds the circular p electrode 20B when viewed in a direction perpendicular to the n-guide layer 14 (i.e., the photonic crystal layer 14P) (hereafter also referred to as "top view"). That is, the groove 16G is a cylindrical groove formed inside an air hole formation region 14R of the photonic crystal layer 14P. A cross section perpendicular to the circumferential direction of the groove 16G has a rectangular shape or a trapezoidal shape, and the bottom surface of the groove 16G is an annular flat surface parallel to the semiconductor layer.

The groove 16G defines a mesa portion (hereafter also simply referred to as "mesa") 16M having a cylindrical mesa shape in the second guide layer 16. The mesa 16M is located inside the air hole formation region 14R when viewed in the direction perpendicular to the photonic crystal layer 14P. The mesa 16M is a cylindrical tableland coaxial with the thin cylindrical air hole formation region 14R.

A p electrode (anode) 20B is formed on the p-contact layer 17 of the mesa 16M.

The side surfaces of the laminated semiconductor layers (i.e., the first semiconductor layer 12, the active layer 15, and the second semiconductor layer 18), the surfaces other than the top surface of the p electrode 20B, and the inside (sides and bottom) of the groove 16G are covered with an insulating film 21 of, for example, $SiO_2$. The insulating film 21 is not hatched for clarity in illustration. A pad electrode 23 is electrically connected to the p electrode 20B.

Light (direct emission light Ld) directly emitted from the photonic crystal layer 14P and light (reflected emission light Lr) emitted from the photonic crystal layer 14P and reflected by the p electrode 20B are emitted to outside from a light-emitting region 20L on the back of the substrate 11.

Figure 1B:
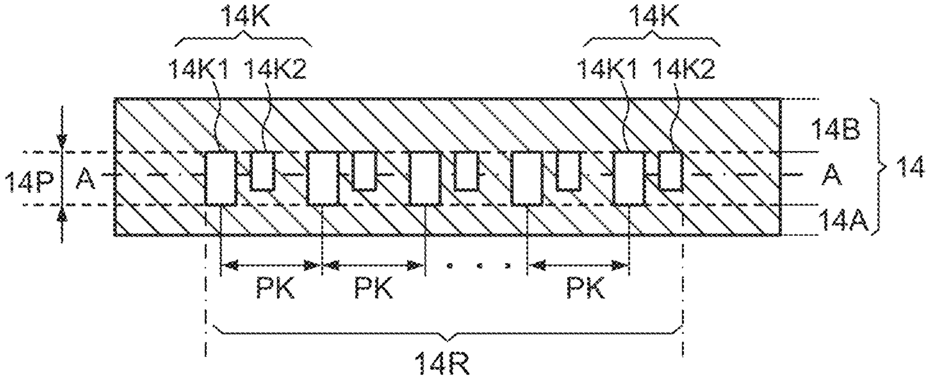
FIG. 1B is an enlarged cross-sectional view schematically illustrating a photonic crystal layer 14P in FIG. 1A and an air hole pair 14K arranged in the photonic crystal layer 14P.

FIG. 1B is an enlarged cross-sectional view schematically illustrating the photonic crystal layer 14P in FIG. 1A and air hole pairs 14K arranged in the photonic crystal layer 14P. The air hole pairs 14K (main air hole 14K1 and sub-air hole 14K2) are formed and embedded in the n-guide layer 14. The air hole pairs 14K are two-dimensionally arranged in a crystal growth plane (semiconductor layer growth plane), i.e., a plane parallel to the n-guide layer 14 (i.e., section taken along line A-A in the drawing) at the respective positions of square lattice points in a square lattice configuration with a period PK, for example.

Figure 2B:
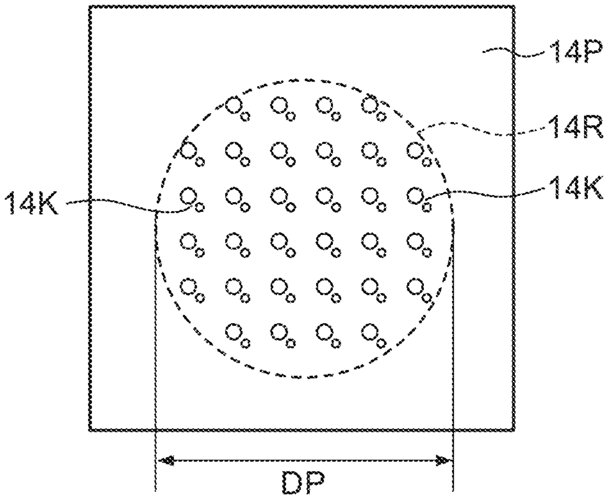
FIG. 2B is a cross-sectional view schematically illustrating a cross section of the photonic crystal layer 14P in a plane parallel to an n-guide layer 14 (i.e. a section taken along line A-A in FIG. 1B).
Figure 2C:
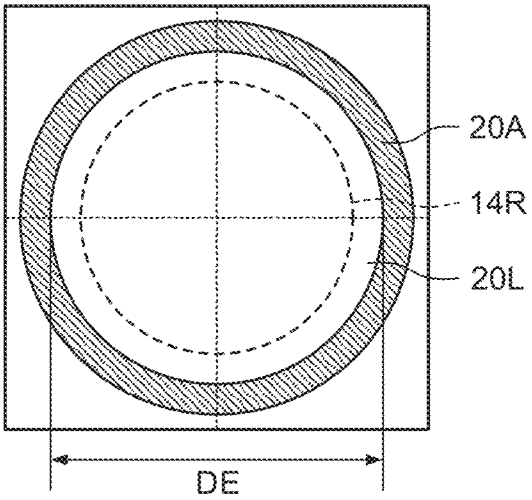
FIG. 2C is a plan view schematically illustrating the bottom surface of the photonic-crystal laser 10.

FIG. 2A is a plan view schematically illustrating the top surface of the photonic-crystal laser (PCSEL) 10. FIG. 2B is a cross-sectional view schematically illustrating a cross section taken along a plane parallel to the n-guide layer 14 of the photonic crystal layer (PC layer) 14P (i.e., section taken along line A-A in FIG. 1B). FIG. 2C is a plan view schematically illustrating the bottom surface of the photonic-crystal laser (PCSEL) 10.

As illustrated in FIG. 2B, the air holes 14K in the photonic crystal layer 14P are periodically arranged within, for example, the circular air hole formation region 14R. As illustrated in FIG. 2C, the n electrode (cathode) 20A is formed as an annular electrode outside the air hole formation region 14R so as not to overlap the air hole formation region 14R when viewed in the direction perpendicular to the photonic crystal layer 14P (top view). The region inside the n electrode 20A is the light-emitting region 20L.

As illustrated in FIG. 1A, the mesa 16M of the second guide layer 16 has a height HM. As illustrated in FIG. 1A, FIG. 2A, and FIG. 2B, the diameter DM of the mesa 16M is smaller than the diameter DP of the air hole formation region 14R in the photonic crystal layer 14P (DM<DP).

The annular n electrode 20A is formed coaxially with the air hole formation region 14R, and the diameter DP of the air hole formation region 14R is smaller than the inner diameter DE of the n electrode 20A (DP<DE).

1. Production Steps of Photonic-Crystal Laser (PCSEL) 10

The production steps of the PCSEL element 10 will be described in detail below. The semiconductor layers were grown and laminated on the substrate 11 (growth substrate) by normal pressure (atmospheric pressure) growth using an MOVPE (metalorganic vapor phase epitaxy) method as a crystal growth method. In the steps described below, Sn refers to step n.

The layer thicknesses, carrier concentrations, group-3 (group-III) and group-5 (group-V) materials, temperatures, etc. described below are only examples unless otherwise specified.

[S1: Substrate Preparation Step]

A "+c"-plane GaN single crystal with (0001) plane where Ga atoms are arranged at the outermost surface as its main surface was prepared as the substrate 11. The main surface of the substrate may be a just plane, or offset up to about 1° in an m-axis direction. For example, a substrate offset up to about 1° in the m-axis direction enables mirror surface growth over a wide range of growth conditions.

The substrate surface (back surface) opposite to the main surface, where the light-emitting region 20L is provided, is "-c"-plane, which is (000-1) plane where N atoms are arranged on the outermost surface. The -c-plane is resistant to oxidation etc., and thus is suitable as a light extraction surface.

In this example, an n-type GaN single crystal was used as the GaN substrate 11. The n-type GaN substrate 11 has a function as a contact layer with an electrode.

[S2: n-Cladding Layer Formation Step]

As the n-cladding layer 13, a 2-μm-thick n-type $Al_{0.04}Ga_{0.96}N$ layer having an Al composition of 4% was grown on the +c-plane GaN substrate 11. The AlGaN layer was grown by supplying trimethylgallium (TMG) and trimethylaluminum (TMA) as group-3 atom sources to the GaN substrate heated to 1100° C., while supplying ammonia ($NH_3$) as a group-5 atom source.

For carrier doping, silane ($SiH_4$) was supplied simultaneously with the foregoing materials (Si doping). The carrier concentration at room temperature was approximately $4\times10^{18}$ $cm^{-3}$.

[S3*a*: Lower Guide Layer and Air-Hole Preparation Layer Formation Step]

Subsequently, TMG was supplied to grow a 250-nm-thick n-type GaN layer as the n-guide layer 14. As with the AlGaN layer, silane ($SiH_4$) was simultaneously supplied for carrier doping. The carrier concentration was approximately $4\text{-}10^{18}$ $cm^{-3}$. The resulting growth layer is a preparation layer for forming the photonic crystal layer 14P in addition to the lower guide layer 14A.

For the sake of simple description and easy understanding, the substrate 11 on which such a growth layer is formed (growth layer-containing substrate) may hereinafter be referred to simply as a substrate.

[S3*b*: Hole Formation Step]

After the formation of the preparation layer, the substrate was taken out of the chamber of the MOVPE apparatus, and fine holes were formed at the surface of the growth layer. After the surface was cleaned, a silicon nitride film ($Si_xN_y$) was deposited on the clean surface using plasma CVD. An electron beam drawing resist was applied thereon by spin coating, and a two-dimensional periodic structure was patterned in an electron beam drawing apparatus.

Figure 3:
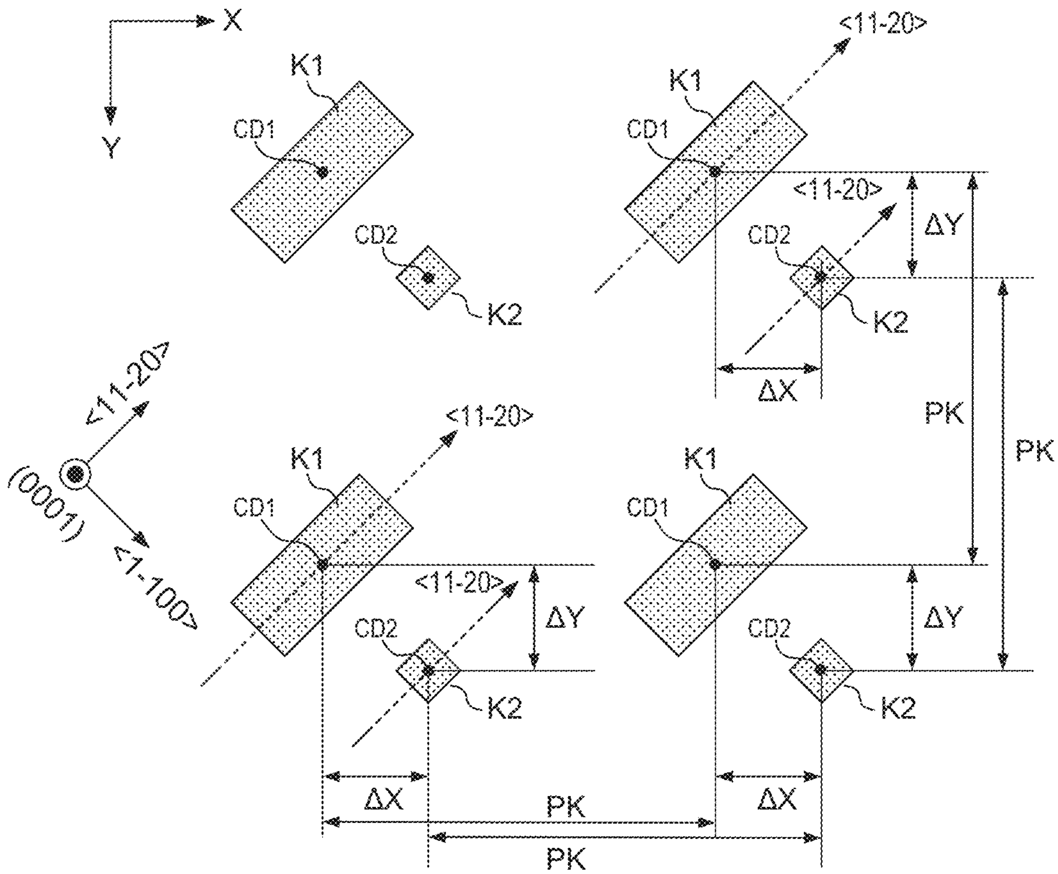
FIG. 3 is a top view schematically illustrating a resist pattern for forming main openings K1 and sub-openings K2 two-dimensionally arranged in a plane in a square lattice configuration.

As illustrated in FIG. 3, patterning was performed with each opening pair of a rectangular main opening K1 and a square sub-opening K2 smaller than the main opening K1 being two-dimensionally arranged in the plane of the resist in a square lattice configuration with period PK=164 nm. The openings are hatched for clarity in illustration.

In more detail, the main openings K1 were arranged with their center-of-gravities CD1 being in a square lattice configuration with period PK=164 nm in two directions (x direction and y direction) orthogonal to each other. Likewise, the sub-openings K2 were arranged with their center-of-gravities CD2 being in a square lattice configuration with period PK=164 nm in x direction and y direction.

Herein, x direction and y direction are respectively directions inclined 45° with respect to the major axis direction (<11-20> direction) and the minor axis direction (<1-100> direction) of the main opening K1. Herein, x-y coordinates are also referred to as "air hole coordinates".

The major axis of the main opening K1 and two sides of the sub-opening K2 were parallel to <11-20> direction of the crystal orientation, and the minor axis of the main opening K1 and the other two sides of the sub-opening K2 were parallel to <1-100> direction. Herein, the "major axis or minor axis" of an air hole (or hole) denotes the major axis or minor axis of a cross section (opening surface) of the air hole in a plane parallel to the photonic crystal layer 14P.

The center-of-gravity CD2 of the sub-opening K2 was separate from the center-of-gravity CD1 of the main opening K1 by Δx and Δy. Here, Δx=Δy. That is, the center-of-gravity CD2 of the sub-opening K2 was separate from the center-of-gravity CD1 of the main opening K1 in <1-100> direction. Specifically, the distance Δx between the center-of-gravities CD1 and CD2 in x direction and the Δy between the center-of-gravities CD1 and CD2 in y direction were 65.6 nm (=PK×0.4).

After the patterned resist was developed, the $Si_xN_y$ film was selectively dry etched in an ICP-RIE (inductive coupled plasma reactive ion etching) apparatus. The main openings K1 and the sub-openings K2 arranged in a square lattice configuration with a period of 164 nm were thus formed through the $Si_xN_y$ film.

The period (air hole pitch) PK was calculated as PK=λ/n=164 nm, where the oscillation wavelength (λ) was 410 nm and the refractive index (n) of GaN was 2.5.

Subsequently, the resist was removed, and holes were formed in the GaN surface portion using the patterned $Si_xN_y$ film as a hard mask. Hole pairs each made up of an elliptic or oval cylindrical hole and a cylindrical hole dug perpendicularly to the GaN surface were formed by dry-etching GaN in the depth direction in the ICP-RIE apparatus using chlorine-based gas and argon gas. That is, an elliptic or oval cylindrical hole and a cylindrical hole were formed respectively at the rectangular main opening K1 and the square sub-opening K2. To make a distinction from the air holes in the photonic crystal layer 14P, the holes formed in the GaN surface portion by the etching in this step are hereafter simply referred to as "holes".

[S3*c*: Cleaning Step]

The substrate in which the holes were formed was subjected to degreasing, and then the $Si_xN_y$ film was removed using buffered hydrofluoric acid (HF).

[S3*d*: Embedding Layer Formation Step]

The substrate was put into the reactor of the MOVPE apparatus again. Ammonia ($NH_3$) was supplied, the temperature of the substrate was increased to 950° C. (first embedding temperature), and then trimethylgallium (TMG) and $NH_3$ were supplied to close each hole pair (main hole and sub-hole) to form the embedding layer 14B.

As a result of this embedding step, the n-guide layer 14 including the photonic crystal layer 14P having a double lattice structure in which the air hole pair 14K made up of the main air hole 14K1 and the sub-air hole 14K2 were arranged at each square lattice point was formed.

[S4: Light-Emitting Layer Formation Step]

Next, a multiple quantum well (MQW) layer was grown as the active layer 15 which is the light-emitting layer. The MQW layer included GaN barrier layers and InGaN well layers. The barrier layers were grown by decreasing the temperature of the substrate to 820° C. and then supplying triethylgallium (TEG) as a group-3 atom source and $NH_3$ as a nitrogen source. The well layers were grown at the same temperature as with the barrier layers, by supplying TEG and trimethylindium (TMI) as group-3 atom sources and $NH_3$ as a nitrogen source. The center wavelength of PL (photoluminescence) emission from the active layer in this example was 412 nm.

[S5: First p-Side Semiconductor Layer Formation Step]

After the growth of the active layer, the temperature of the substrate was increased to 1050° C., and a 120-nm-thick GaN layer was grown as the first p-side semiconductor layer 16A. The first p-side semiconductor layer 16A was grown by supplying TMG and $NH_3$ without doping with a dopant.

[S6: Electron Blocking Layer Formation Step]

After the growth of the first p-side semiconductor layer 16A, the electron blocking layer (EBL) 16B was grown while maintaining the substrate temperature at 1050° C. The EBL 16B was grown by supplying TMG and TMA as group-3 atom sources and $NH_3$ as a nitrogen source. In addition, Cp2Mg was supplied as a p-dopant. The EBL 16B having an Al composition of 18% and a thickness of 17 nm was thus formed.

[S7: Second p-Side Semiconductor Layer Formation Step]

After the growth of the electron blocking layer (EBL) 16B, the second p-side semiconductor layer 16C was grown while maintaining the substrate temperature at 1050° C. The second p-side semiconductor layer 16C was grown by supplying TMG and TMA as group-3 atom sources and $NH_3$ as a nitrogen source. In addition, Cp2Mg was supplied as a p-dopant. The second p-side semiconductor layer 16C having an Al composition of 6% and a thickness of 600 nm was thus formed. The p-cladding layer (p-AlGaN) 18 had a carrier concentration of $2\times10^{17}$ $cm^{-3}$ when activated in the $N_2$ atmosphere at 850° C. for 10 minutes after the growth.

As a result of the formation of the second p-side semiconductor layer 16C, the second guide layer 16 composed of the first p-side semiconductor layer 16A, the EBL 16B, and the second p-side semiconductor layer 16C was formed.

[S8: p-Contact Layer Formation Step]

After the growth of the second p-side semiconductor layer 16C, the p-contact layer 17 of 25 nm in thickness was grown while maintaining the substrate temperature at 1050° C. The p-contact layer 17 was grown by supplying TMG as a group-3 atom source and $NH_3$ as a nitrogen source. In addition, Cp2Mg was supplied as a dopant.

[S9: Element Isolation Groove Formation Step]

$SiO_2$ was applied to the surface of the growth layer-containing substrate on which the formation of the epitaxial growth layers was completed, by a spin-on-glass (SOG) method. Element isolation grooves were patterned on the applied $SiO_2$ film using photolithography. Using $SiO_2$ as a mask, etching was performed by vapor-phase etching until the n-side cladding layer 13 or the growth substrate 11 was exposed. After that, the $SiO_2$ mask was removed by BHF to form the element isolation grooves.

[S10: Groove and Mesa Formation Step]

$SiO_2$ was applied to the surface again by the SOG method. The applied $SiO_2$ film was patterned using photolithography, to form a mask. Using the $SiO_2$ mask, the groove 16G reaching the inside of the p-guide layer (second guide layer) 16 was formed by vapor-phase etching. As a result of the formation of the annular groove 16G, the cylindrical mesa 16M (mesa portion) of the p-guide layer 16 was formed inside the groove 16G, as illustrated in FIG. 2A.

The mesa 16M is a cylindrical tableland inside the outer edges of the air hole formation region 14R and concentric with the air hole formation region 14R, when viewed in the direction perpendicular to the photonic crystal layer 14P. The mesa 16M has the height HM, as illustrated in FIG. 1A.

[S11: Anode Electrode Formation Step]

Palladium (Pd) of 100 nm in thickness was deposited on the surface of the epitaxial growth substrate by electron beam deposition, as a p electrode metal layer. The p electrode metal layer was patterned by photolithography, to form the p electrode 20B of 200 μm in diameter on the p-contact layer 17.

[S12: Insulating Film Formation Step]

A mask was formed on the p electrode 20B by photolithography, and then a $SiO_2$ insulating film (protective film)

of 200 nm in thickness was formed by sputtering. The $SiO_2$ insulating film 21 on the p electrode 20B was removed by lift-off.

[S13: p-Side Pad Electrode Formation Step]

A mask was formed on the top surface of the PCSEL element 10 by photolithography, and then metal layers of titanium/platinum/titanium/gold (Ti/Pt/Ti/Au) were formed in this order by sputtering through electron beam deposition. The metal layers around the top surface of the PCSEL element 10 were removed by lift-off, to form the pad electrode 23.

[S14: Substrate Polishing Step]

Next, the back surface of the substrate was ground to a thickness of 150 μm, and further mirror-polished by diamond slurry and a chemical mechanical polishing (CMP) method.

[S15: Work-Affected Layer Removal Step]

Following this, the emission surface was wet-etched with a KOH solution to remove the work-affected layer. The work-affected layer may be removed by wet etching using a NaOH solution, a 4-methylammonium hydroxide (TMAH) solution, or the like, or by dry etching using a chlorine-based gas.

[S16: Cathode Electrode Formation Step]

Following this, Ti and Au were deposited in sequence on the back surface of the substrate 11 by electron beam deposition and patterned annually, to form the n electrode 20A.

[S17: Antireflection Film Formation Step]

$SiO_2$ was deposited on the inside of the annular n electrode 20A as the laser light emitting surface by sputtering, to form the antireflection film 22. The antireflection film may be a single-layer film, or a multilayer film combined with another dielectric film.

[S18: Dicing Step]

Lastly, laser scribing was performed along the center lines of the element isolation grooves, thus obtaining the diced PCSEL element 10.

2. Air Hole Layer

Figure 4:
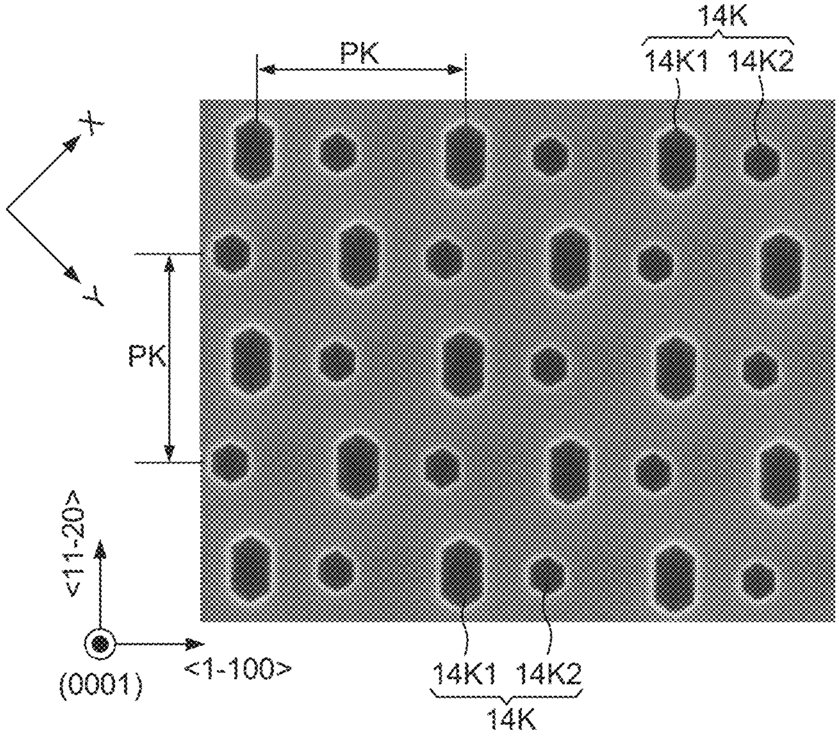
FIG. 4 is a SEM image illustrating air hole shapes in the photonic crystal layer 14P in the example.

FIG. 4 is a scanning electron microscope (SEM) image illustrating the shapes of the air holes in the photonic crystal layer 14P in this example. The same applies to a SEM image of the photonic crystal layer 14P in Comparative Example 1 described later.

To determine the shapes of the embedded air holes in this example, the laminate structure was processed from the surface by a focused ion beam (FIB) until the air holes in the photonic crystal layer 14P were exposed, and then SEM observation was performed.

The air hole pairs each made up of the long-hexagonal prism-shaped air hole (main air hole) 14K1 and the regular-hexagonal prism-shaped air hole (sub-air hole) 14K2 were observed. The main air hole 14K1 had a long-hexagonal prism shape with a major axis parallel to <11-20> axis. The sub-air hole 14K2 was smaller than the main air hole 14K1 in size (for example, air hole diameter and/or depth).

Thus, the formation of the photonic crystal layer 14P of a double lattice structure in which the air hole pairs 14K each made up of the main air hole 14K1 and the sub-air hole 14K2 were arranged at the respective square lattice points with period PK was observed.

3. Device Characteristics

The device characteristics of the PCSEL element 10 in Example 1 produced in the above-described manner and the device characteristics of a PCSEL element 90 in Comparative Example 1 were evaluated. The PCSEL element 90 in Comparative Example 1 was different from the PCSEL element 10 in Example 1 only in that the groove 16G was not formed, and was the same as the PCSEL element 10 in Example 1 in the other structures.

Figure 5:
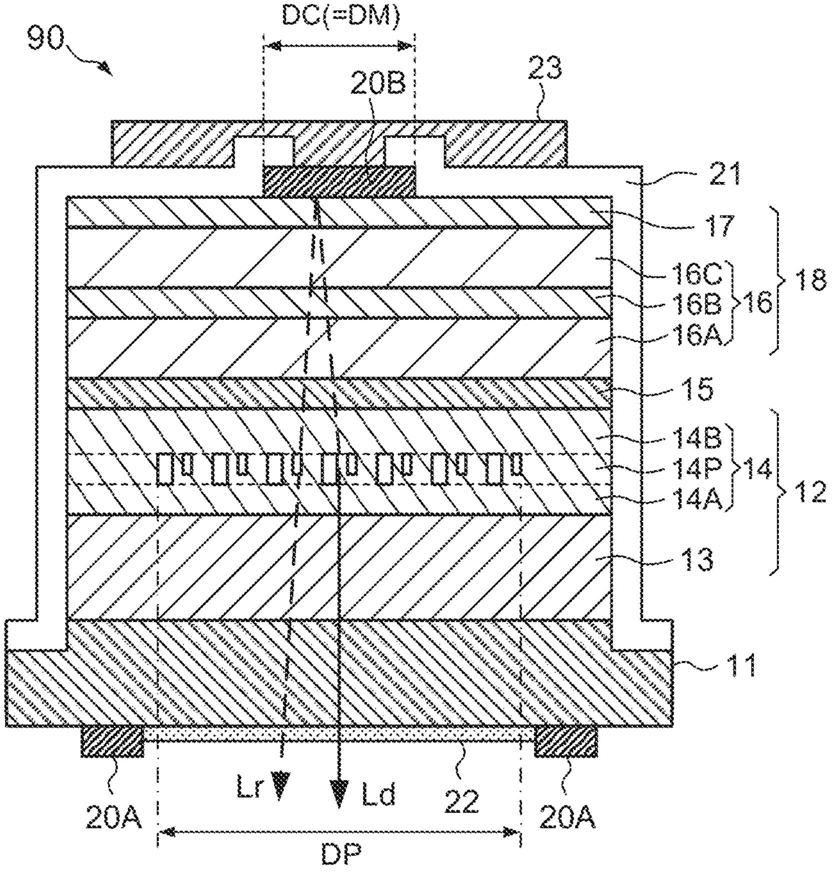
FIG. 5 is a cross-sectional view schematically illustrating a PCSEL element 90 in Comparative Example 1.

FIG. 5 illustrates the PCSEL element 90 in Comparative Example 1. In the PCSEL element 90 in Comparative Example 1, the mesa 16M was not formed, and the surface of the second guide layer 16 was flat. That is, the p-contact layer 17 and the second guide layer 16 had uniform thicknesses.

The p electrode 20B coaxial with the air hole formation region 14R was formed on the surface of the p-contact layer 17. The diameter DC of the p electrode 20B was equal to the diameter DM of the mesa 16M in the PCSEL element 10 in Example 1 (DC=DM).

Pulse current with a repetition frequency of 1 kHz and a pulse width of 100 ns (nanoseconds) was flown through each of the produced PCSEL element 10 (Example 1) and PCSEL element 90 (Comparative Example 1), and the beam shape was measured.

Figure 6A:
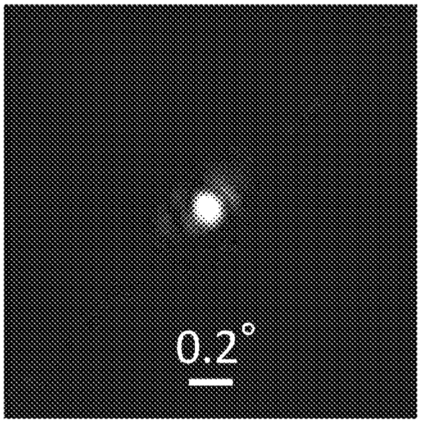
FIG. 6A is a far-field image of the PCSEL element 10 in Example 1.
Figure 6B:
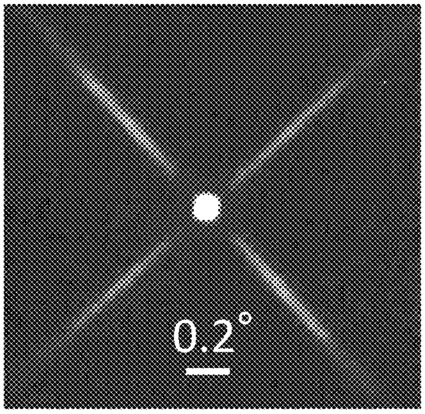
FIG. 6B is a far-field image of the PCSEL element 90 in Comparative Example 1.

FIG. 6A is a far-field image of the PCSEL element 10 in Example 1. FIG. 6B is a far-field image of the PCSEL element 90 in Comparative Example 1. In the PCSEL element 10 in Example 1, a unimodal beam was obtained with a spread angle of 0.2° or less. In the PCSEL element 90 in Comparative Example 1, not only a unimodal beam but also a linear (cross-shaped) higher-order mode was observed with a spread angle of 0.2° or less.

It was thus confirmed that, in the PCSEL element 10 in Example 1, higher-order mode (transverse mode) was suppressed and unimodal laser light of high beam quality was obtained. This is examined below.

Figure 7:
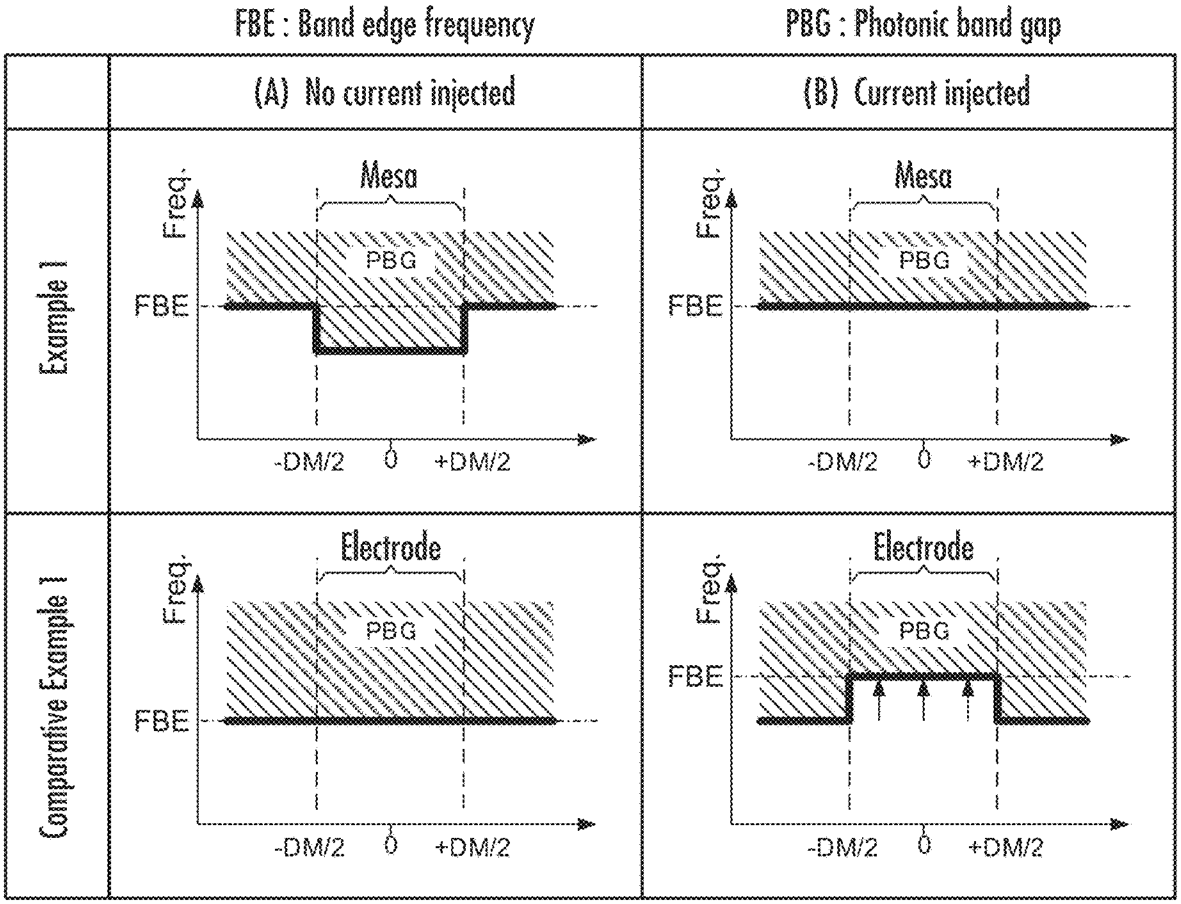
FIG. 7 is a diagram schematically illustrating oscillation mode frequency against spatial position in comparison between Example 1 and Comparative Example 1.

FIG. 7 is a diagram schematically illustrating oscillation mode frequency against spatial position. Comparison between Example 1 and Comparative Example 1 is made in the drawing. In the drawing, the band edge frequency FBE (photonic band edge frequency) is designated by dashed lines, and the photonic band gap (PBG) is designated by hatching. The mesa region (Example 1) and the electrode region (Comparative Example 1) as the current injection region are also illustrated.

The photonic band gap (PBG) means a forbidden band of light. That is, the photonic band gap indicates a frequency region in which light cannot exist, and light having a frequency within the region cannot be transmitted.

With reference to FIG. 7, in Comparative Example 1, the band edge frequency FBE is constant inside and outside the electrode region (the p electrode 20B), when no current is injected (A). When current is injected (B), on the other hand, the carrier density increases and the refractive index decreases in the semiconductor layer inside the electrode region as the current injection region as compared with the semiconductor layer outside the electrode region.

Hence, the band edge frequency in the semiconductor layer inside the electrode region is higher than the band edge frequency in the semiconductor layer outside the electrode region. That is, the leakage of light to the region (i.e. absorption region that is not transparent) outside the electrode region decreases, and horizontal optical confinement increases. As a result, the threshold gain difference between basic mode and higher-order mode decreases, and oscillation in higher-order mode tends to occur. Thus, the transverse mode controllability decreases, and multimode oscillation tends to occur.

In Example 1, the effective refractive index is lower in the semiconductor layer (i.e., the region of the groove 16G) outside the mesa region than in the semiconductor layer inside the mesa region. Accordingly, the band edge frequency inside the mesa region is lower than the band edge frequency outside the mesa region when no current is injected (A).

When current is injected (B), even when the carrier density increases and the refractive index decreases in the semiconductor layer inside the mesa region, the difference in band edge frequency between the semiconductor layer inside the mesa region and the semiconductor layer outside the mesa region can be reduced. FIG. 7 illustrates the case where the difference is zero. In particular, in high current injection operation, laser light of high beam quality with stable basic mode oscillation can be obtained.

In more detail, as the difference in band edge frequency decreases, the leakage of light to outside the electrode region (mesa region) increases as compared with Comparative Example 1. The basic mode has a shape with an electric field strength peak in the center of the electrode, while the higher-order mode has an electric field strength peak off the center of the electrode, so that the effect of light leakage (that is, loss) is higher in the higher-order mode than in the basic mode. Consequently, the threshold gain difference between the basic mode and the higher-order mode increases, and the higher-order mode is suppressed.

The decrease in the threshold gain difference between the basic mode and the higher-order mode can thus be suppressed, so that laser light of high beam quality with oscillation in higher-order mode being suppressed can be obtained.

Example 2

Figure 8:
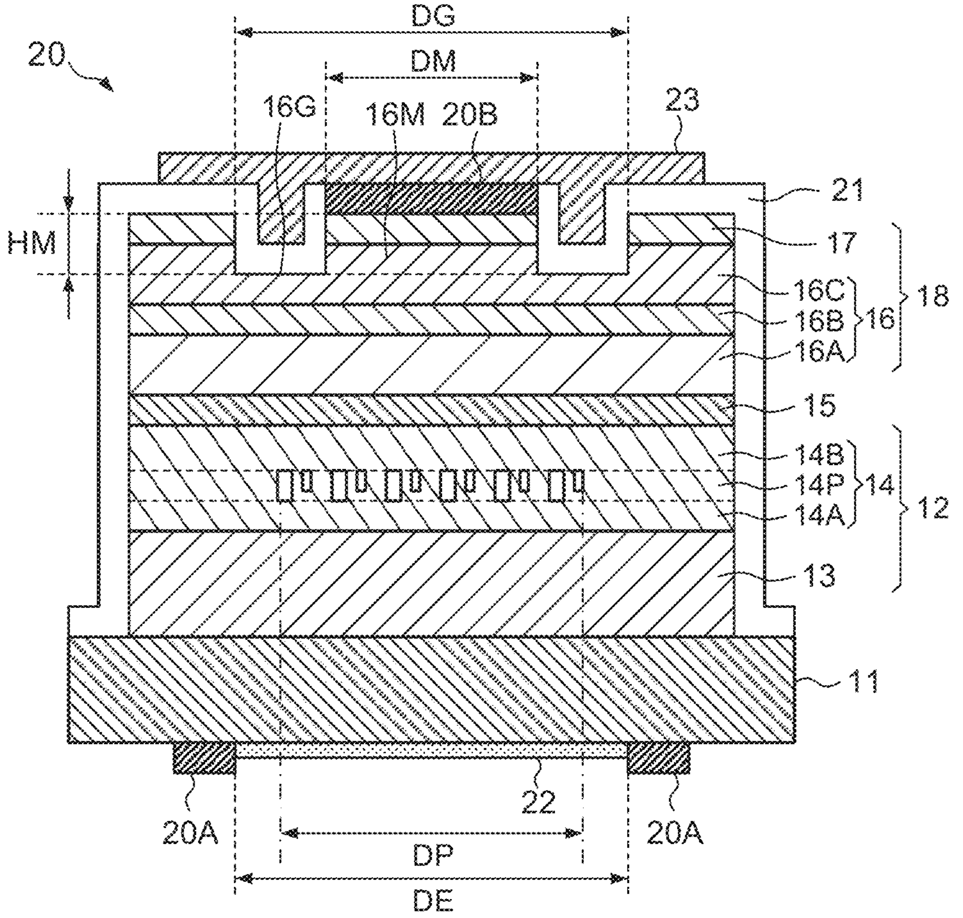
FIG. 8 is a cross-sectional view schematically illustrating an example of the structure of a PCSEL element 20 in Example 2.

FIG. 8 is a cross-sectional view schematically illustrating an example of the structure of a PCSEL element 20 in Example 2. The semiconductor layer structure in the PCSEL element 20 in Example 2 is the same as that described in Example 1. The mesa structure in the PCSEL element 20 will be mainly described in detail below.

In the PCSEL element 20 in Example 2, the groove 16G is formed on the second semiconductor layer 18 from the surface of the second semiconductor layer 18 (i.e., the surface of the p-contact layer 17) to the inside of the second p-side semiconductor layer 16C, as in Example 1. The groove 16G defines the mesa 16M in the second guide layer 16.

The mesa 16M has a cylindrical shape coaxial with the air hole formation region 14R, and is formed inside the air hole formation region 14R when viewed in the direction perpendicular to the photonic crystal layer 14P. That is, the diameter DM of the mesa 16M is smaller than the diameter DP of the air hole formation region 14R in the photonic crystal layer 14P (DM<DP).

The diameter DG of the outer periphery of the groove 16G (or the outer periphery of the bottom surface of the groove 16G) is greater than or equal to the diameter DP of the air hole formation region 14R in the photonic crystal layer 14P (DP 5 DG).

As described above with reference to FIG. 7, also in the PCSEL element 20 in Example 2, at current injection, even when the carrier density increases and the refractive index decreases in the semiconductor layer inside the mesa region, the difference in band edge frequency between the semiconductor layer inside the mesa region and the semiconductor layer outside the mesa region can be reduced.

In the PCSEL element 20 in Example 2, the diameter DG of the outer periphery of the groove 16G is greater than or equal to the diameter DP of the air hole formation region 14R (DP≤DG), so that the difference in refractive index (band edge frequency) between the inside and the outside of the mesa region at current injection can be reduced throughout the outer peripheral region of the air hole formation region 14R.

The decrease in the threshold gain difference between the basic mode and the higher-order mode can thus be suppressed, so that laser light of high beam quality with oscillation in higher-order mode being suppressed can be obtained. In particular, in high current injection operation, laser light of high beam quality with stable basic mode oscillation can be obtained.

Although the above describes the case where the air hole formation region 14R in the photonic crystal layer 14P has a circular shape in a top view, the present invention is not limited to such. In the case where the air hole formation region 14R has a shape other than a circular shape, it is preferable to ensure that the outer periphery of the groove 16G is outside the air hole formation region 14R, i.e., the outer periphery of the groove 16G contains the air hole formation region 14R in a top view.

Example 3

Figure 9:
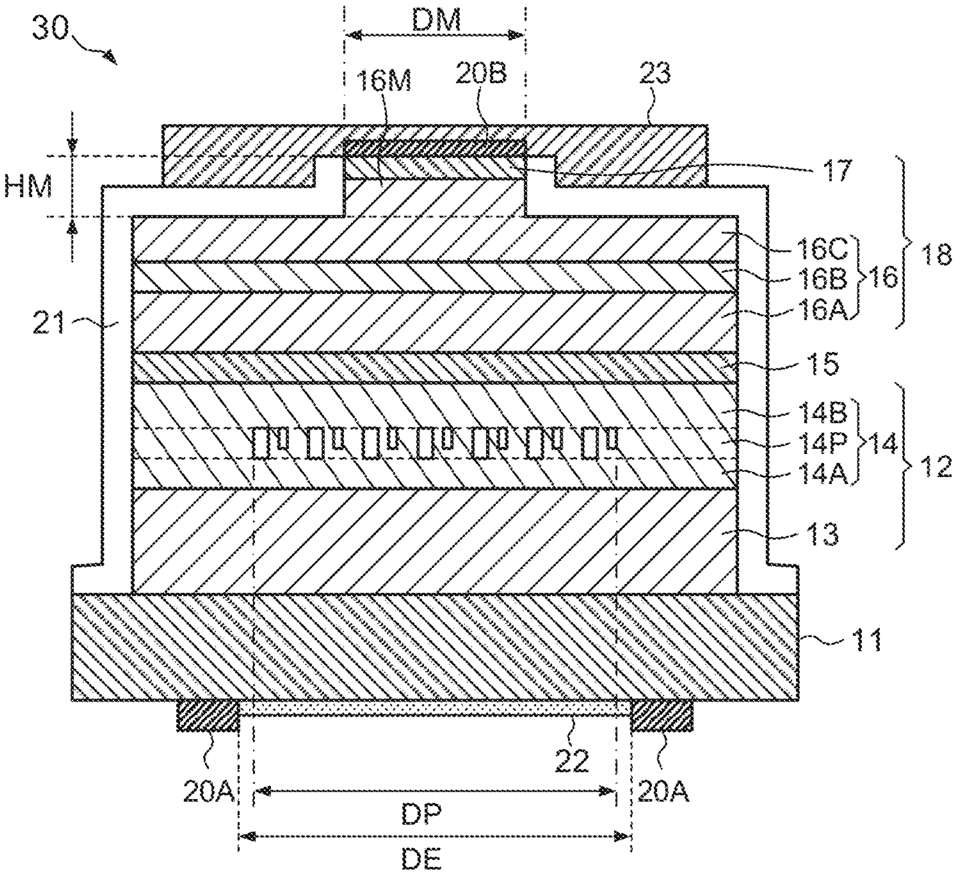
FIG. 9 is a cross-sectional view schematically illustrating an example of the structure of a PCSEL element 30 in Example 3.

FIG. 9 is a cross-sectional view schematically illustrating an example of the structure of a PCSEL element 30 in Example 3. In the PCSEL element 30 in Example 3, the mesa 16M is formed in the second guide layer 16 in the PCSEL element 30, but the region of the second guide layer 16 other than the cylindrical mesa 16M is flat (i.e., equal in thickness), as compared with the PCSEL element 10 in Example 1.

In the PCSEL element 30, the mesa 16M is formed inside the air hole formation region 14R when viewed in the direction perpendicular to the photonic crystal layer 14P, as in the PCSEL element 10 in Example 1. The mesa 16M is a cylindrical tableland coaxial with the thin cylindrical air hole formation region 14R.

The mesa 16M has a diameter DM and a height HM. The diameter DM of the mesa 16M is less than the diameter DP of the air hole formation region 14R in the photonic crystal layer 14P (DM<DP). The diameter DP of the air hole formation region 14R is less than the inner diameter DE of the n electrode 20A (DP<DE).

As described above with reference to FIG. 7, also in the PCSEL element 30 in Example 3, at current injection, even when the carrier density increases and the refractive index decreases in the semiconductor layer inside the mesa region, the difference in band edge frequency between the semiconductor layer inside the mesa region and the semiconductor layer outside the mesa region can be reduced. The decrease in the threshold gain difference between the basic mode and the higher-order mode can thus be suppressed, so that laser light of high beam quality with oscillation in higher-order mode being suppressed can be obtained. In particular, in high current injection operation, laser light of high beam quality with stable basic mode oscillation can be obtained.

Example 4

Figure 10:
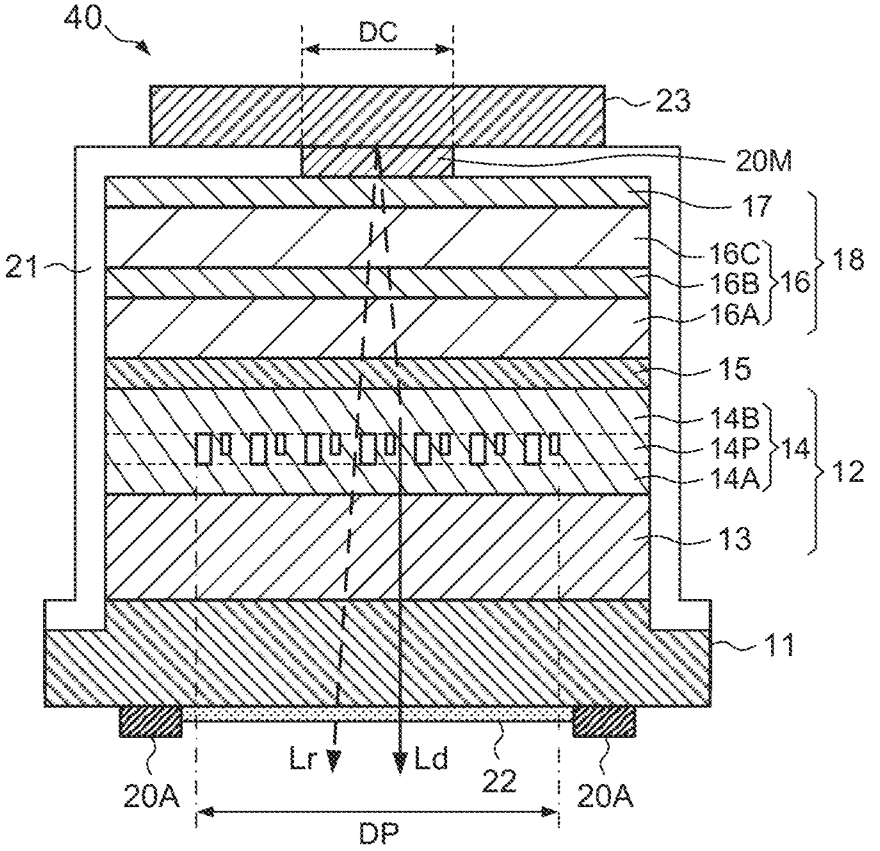
FIG. 10 is a cross-sectional view schematically illustrating an example of the structure of a PCSEL element 40 in Example 4.

FIG. 10 is a cross-sectional view schematically illustrating an example of the structure of a PCSEL element 40 in Example 4. In the PCSEL element 40 in this example, the surface of the second semiconductor layer 18 (i.e., the surface of the p-contact layer 17) is flat, and a mesa 20M as a mesa portion is formed on the p-contact layer 17.

The mesa 20M is a layer of indium tin oxide (ITO) which is a metal oxide and is a translucent conductor. The mesa 20M functions as a p electrode. An Ag (silver) layer (not illustrated) is formed on the top surface of the mesa 20M, thus forming an ITO/Ag electrode structure. The pad electrode 23 is located thereon.

The mesa 20M is a cylindrical layer coaxial with the air hole formation region 14R, and is formed inside the air hole formation region 14R when viewed in the direction perpendicular to the photonic crystal layer 14P. In other words, the diameter DM of the mesa 20M is less than the diameter DP of the air hole formation region 14R in the photonic crystal layer 14P (DM<DP).

The side surfaces of the laminated semiconductor layers (i.e., the first semiconductor layer 12, the active layer 15, and the second semiconductor layer 18) and the surfaces other than the top surface of the second semiconductor layer 18 and the top surface of the mesa 20M are covered with the insulating film 21 such as $SiO_2$.

In the PCSEL element 40, the mesa 20M (ITO layer) is used as a p electrode in mesa shape. ITO functions not only as an electrode but also as part of a cladding layer, for its transparency and refractive index (refractive index n=2.0 to 2.2).

In this example, the second p-side semiconductor layer 16C (layer thickness: 200 nm) is thinner than the second p-side semiconductor layer 16C (layer thickness: 600 nm) in the foregoing examples.

The $SiO_2$ insulating film 21 formed outside the mesa 20M (ITO layer) has refractive index n=1.4 to 1.55, and the effective refractive index is higher in the current injection region (mesa 20M (ITO layer)) than in the non-current injection region.

By making the effective refractive index different in this way, the same effects as the mesas in the foregoing examples can be obtained, so that mode stabilization can be achieved.

With this structure, the damage to the crystal caused by dry etching in mesa formation can be avoided. Moreover, the manufacturing steps can be simplified.

Further, the ITO/Ag electrode structure enables laser light emitted to the p electrode side to be efficiently reflected toward the substrate side, which contributes to higher efficiency. In addition, the second p-side semiconductor (p-AlGaN) layer having relatively high resistance can be reduced in thickness, which contributes to higher efficiency and higher output.

Although the above describes the case where the mesa 20M is made of ITO, the translucent oxide conductor is not limited to indium oxide-based, and may be ZnO-based, ZrO-based, GaO-based, SnO-based, or based on any alloy thereof. Although the above describes the case where the ITO/Ag electrode structure is used, not only Ag but also a metal having high reflectance such as Al, Rh, Ru, Pt, Pd, or Au or any alloy thereof may be used. A reflective film made of a dielectric multilayer film may be used instead of metal.

As described in detail above, according to the present invention, it is possible to provide a photonic-crystal laser (PCSEL) element of high beam quality with oscillation in higher-order mode being suppressed.

In the foregoing examples, “circular shape” is not limited to a perfect circular shape and includes an elliptic shape, an oval shape, and the like, and “cylindrical shape” includes an elliptic cylindrical shape, an oval cylindrical shape, and the like.

For example, although the foregoing examples each describe the case where the air hole formation region 14R is circular when viewed in the direction perpendicular to the photonic crystal layer (top view), the present invention is not limited to such. For example, the air hole formation region may have an elliptic shape, an oval shape, or the like. Alternatively, the air hole formation region may have a n-sided shape including a square or a rectangle (n is an integer of 4 or more).

The air hole formation region may be formed over the entire photonic crystal layer 14P.

Although the foregoing examples each describe the case where the mesa is cylindrical, the present invention is not limited to such. For example, the mesa may have an n-gonal prism shape including a quadrangular prism shape (n is an integer of 4 or more).

The mesa structure preferably has a shape corresponding to the air hole formation region and has a columnar shape corresponding to the formation region.

Although the foregoing examples each describe a photonic-crystal laser element having a photonic crystal layer of a double lattice structure, the present invention is not limited to such, and is equally applicable to a photonic-crystal laser element having a photonic crystal of a single lattice structure.

Although the foregoing examples each describe a photonic-crystal laser made of a nitride semiconductor, the present invention is not limited to such, and is equally applicable to a photonic-crystal laser made of any other crystal-based semiconductor.

The numerical values in the foregoing examples are merely examples, and can be appropriately modified and applied.

DESCRIPTION OF REFERENCE NUMERALS

10, 20, 30, 40 PCSEL element
11 substrate
12 first semiconductor layer
13 first cladding layer
14 first guide layer
14A lower guide layer
14P photonic crystal layer
14B embedding layer
15 active layer
16 second guide layer
16A first p-side semiconductor layer
16B electron blocking layer
16C second p-side semiconductor layer
16G groove
16M, 20M mesa portion
17 p-contact layer
18 second semiconductor layer
20A first electrode
20B second electrode
20L light-emitting region
21 insulating film
23 pad electrode
90 PCSEL element (comparative example)
DM diameter of mesa
DP diameter of air hole formation region

The invention claimed is:

1. A photonic-crystal surface-emitting laser element including a photonic crystal layer, the photonic-crystal surface-emitting laser element comprising:

a first semiconductor layer formed by embedding the photonic crystal layer that includes air holes arranged with two-dimensional periodicity in a formation region in a plane parallel to the photonic crystal layer;

an active layer formed on the first semiconductor layer;

a second semiconductor layer formed on the active layer; and a mesa portion with a mesa shape formed at a surface of the second semiconductor layer, the surface of the second semiconductor layer being flat, wherein the mesa portion is located inside the formation region of the air holes when viewed in a direction perpendicular to the photonic crystal layer, wherein the mesa portion is made of a translucent conductor, and wherein a pad electrode is located on the mesa portion.

2. The photonic-crystal surface-emitting laser element according to claim 1, wherein the formation region of the air holes has a circular shape, and the mesa portion has a cylindrical shape coaxial with the formation region of the air holes.

3. The photonic-crystal surface-emitting laser element according to claim 1, wherein an outer periphery of the mesa portion is located inside the formation region of the air holes when viewed in the direction perpendicular to the photonic crystal layer.

4. The photonic-crystal surface-emitting laser element according to claim 1, wherein an insulating film is formed on an upper surface of the second semiconductor layer, excluding the mesa portion.

5. The photonic-crystal surface-emitting laser element according to claim 1, wherein a refractive index of the mesa portion is adjusted such that, when no current is injected, an effective refractive index of the mesa portion is lower than that of a region outside the mesa portion, and when current is injected, the effective refractive index becomes approximately the same as that of a region where the mesa portion is formed.

* * * * *